United States Patent [19]

Pentak et al.

[11] Patent Number: 4,727,013
[45] Date of Patent: Feb. 23, 1988

[54] METHOD FOR CREATING A DESIGN IN RELIEF IN A HARD SMOOTH SUBSTRATE AND APPARATUS FOR USE IN THE METHOD

[75] Inventors: William F. Pentak, Houston; Dewey L. Burkes, Pasadena, both of Tex.

[73] Assignee: Vacuum Applied Coatings Corp., Pearland, Tex.

[21] Appl. No.: 923,347

[22] Filed: Oct. 27, 1986

Related U.S. Application Data

[63] Continuation of Ser. No. 777,243, Sep. 18, 1985, Pat. No. 4,652,513.

[51] Int. Cl.⁴ ............................................. G03C 5/00
[52] U.S. Cl. ................................. 430/320; 430/322; 430/325; 430/326; 430/329; 430/331
[58] Field of Search ............... 430/325, 320, 322, 326, 430/329, 331

[56] References Cited

U.S. PATENT DOCUMENTS

| | | | |
|---|---|---|---|
| 3,404,057 | 10/1968 | Heiart | 156/522 |
| 3,469,982 | 9/1969 | Celeste | 96/35.1 |
| 3,547,730 | 12/1970 | Cohen et al. | 156/345 |
| 3,629,036 | 12/1971 | Isaacson | 156/241 |
| 3,984,244 | 10/1976 | Collier et al. | 96/67 |
| 4,193,797 | 3/1980 | Cohen et al. | 430/258 |
| 4,456,680 | 6/1984 | Nakamura et al. | 430/258 |
| 4,468,453 | 8/1984 | Nakamura et al. | 430/269 |
| 4,530,896 | 7/1985 | Christensen et al. | 430/155 |
| 4,544,619 | 10/1985 | Christensen et al. | 430/258 |
| 4,599,297 | 7/1986 | Yazaki et al. | 430/256 |

FOREIGN PATENT DOCUMENTS 0047627 3/1982 European Pat. Off. .
2009955 6/1979 United Kingdom .

OTHER PUBLICATIONS

"Dry Film Photoresists in Microelectronics," Denis G. Kelemen, published Aug., 1976, in *Solid State Technology*, vol. 19, No. 8, pp. 37-38.

*Primary Examiner*—John E. Kittle
*Assistant Examiner*—Patrick J. Ryan
*Attorney, Agent, or Firm*—Arnold, White & Durkee

[57] ABSTRACT

A method is provided for acid etching or sandblasting decorative designs in the smooth surface of hard substrates such as glass, ceramics, plastics, and marble, granite, or other stones. A dry film photoresist, preferably a solder mask, is applied to the smooth surface without the addition of heat. The decorative design is placed on the dry film by exposing the dry film to ultraviolet light through a negative of the design to place the design on the surface of the photoresist. The dry film is then developed to remove a portion of it. The smooth surface is then acid etched or sandblasted, with the portion of the dry film remaining on the smooth surface protecting that portion of the smooth surface from the acid etching or sandblasting process. An apparatus is also provided for applying the dry film photoresist to the substrate.

8 Claims, 16 Drawing Figures

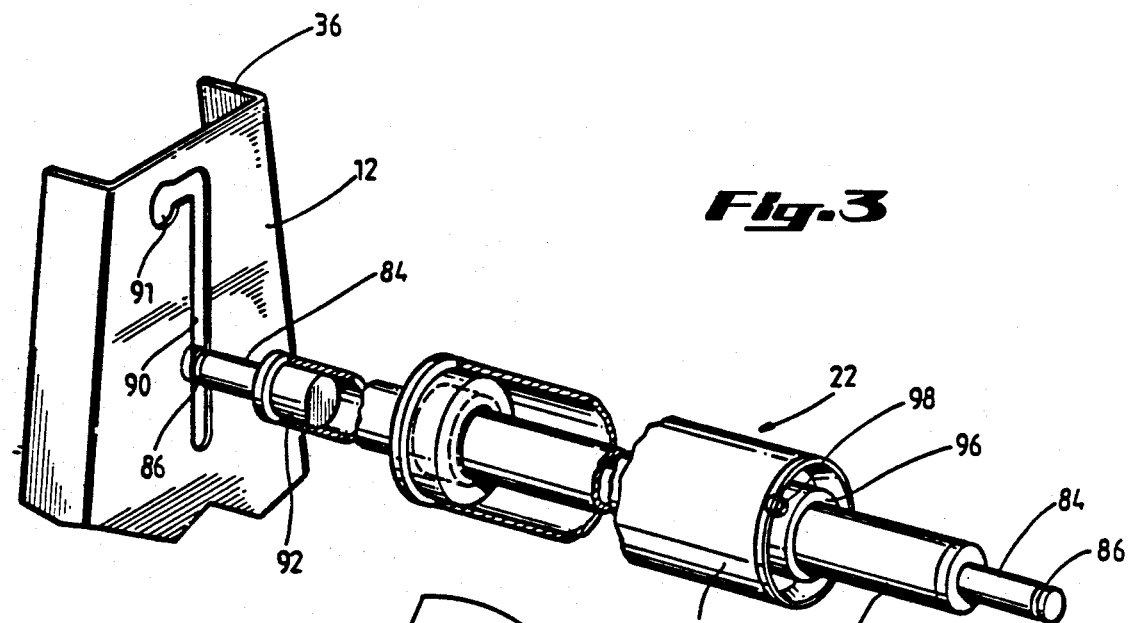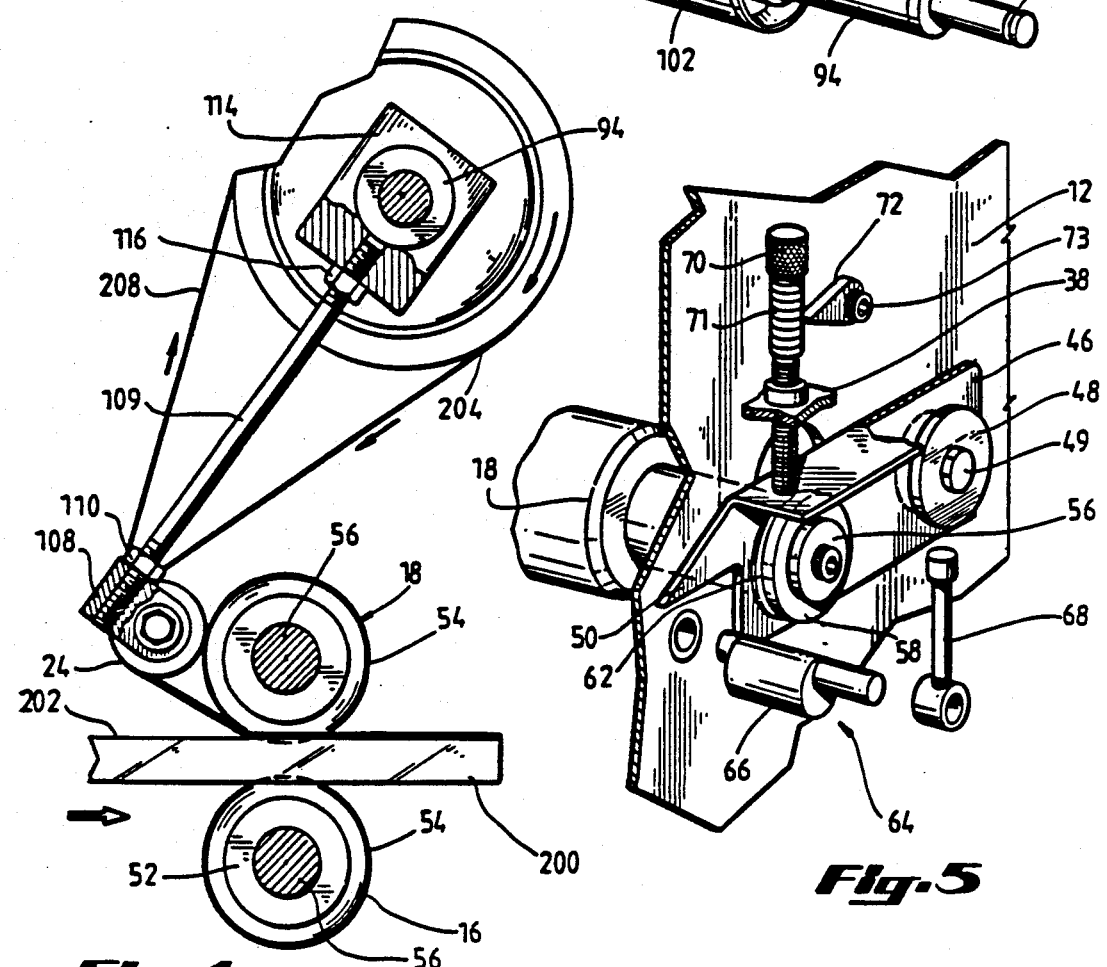

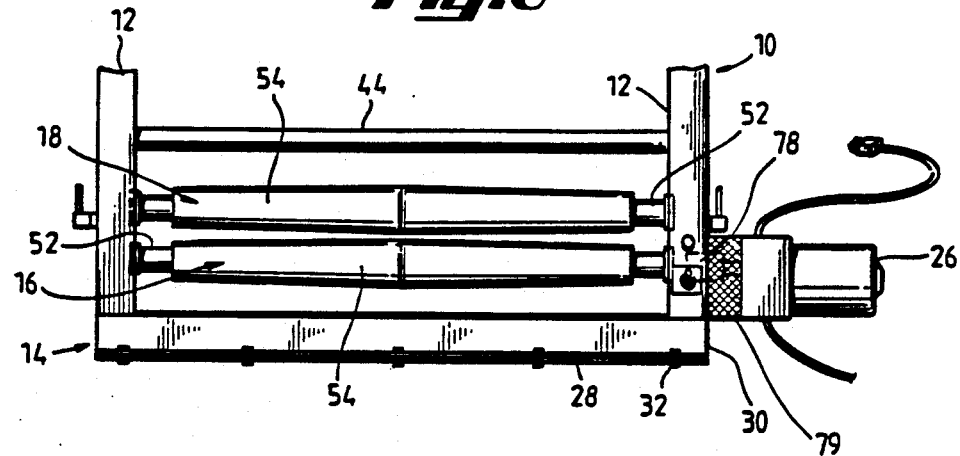
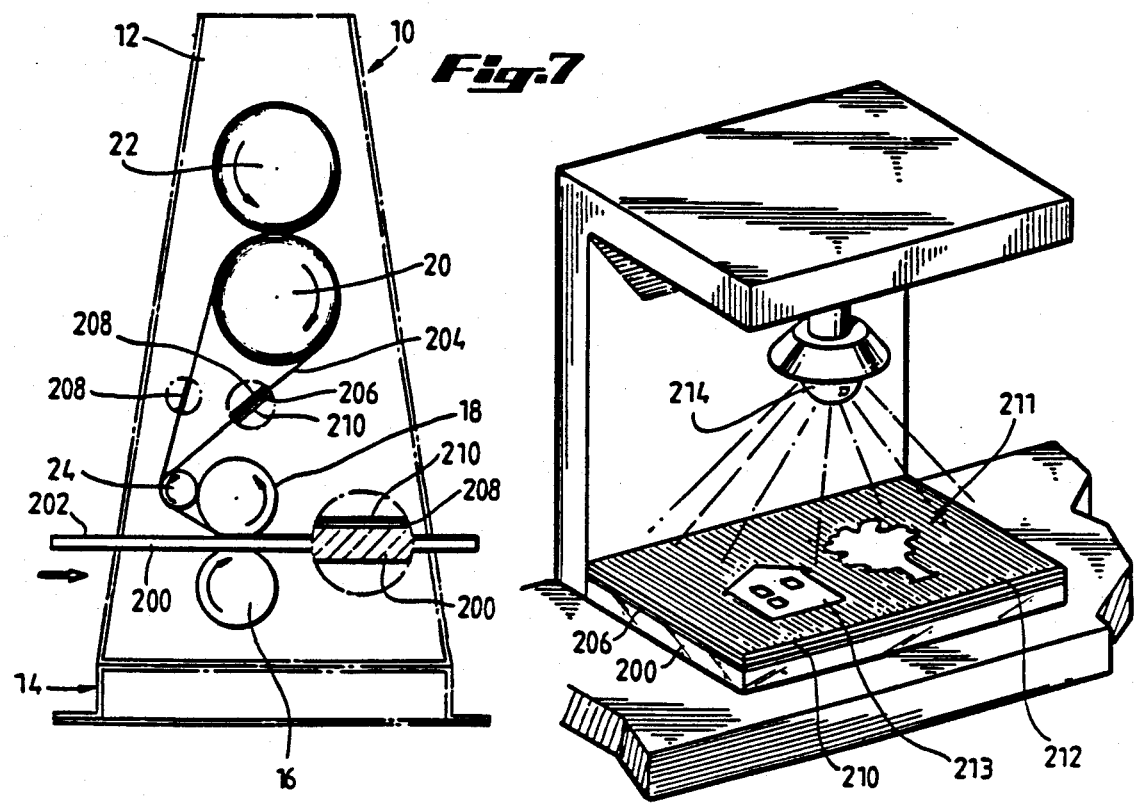

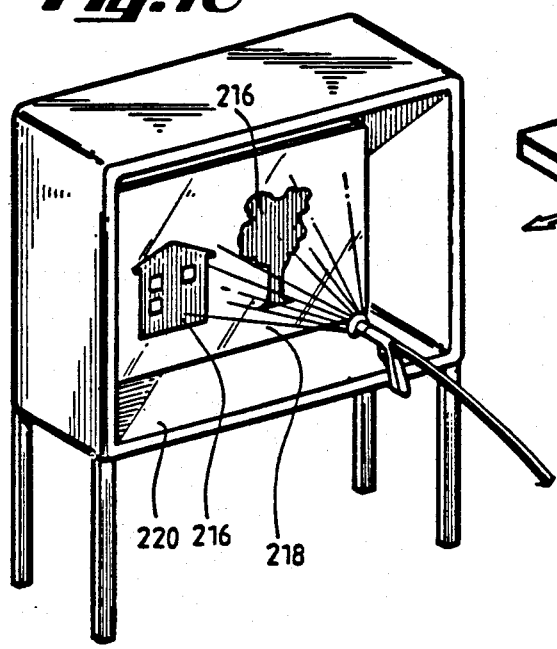
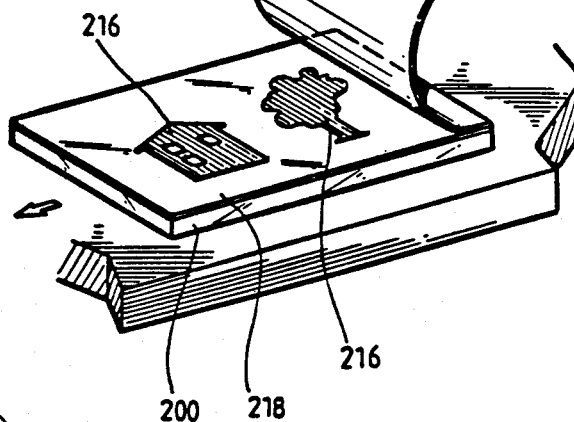
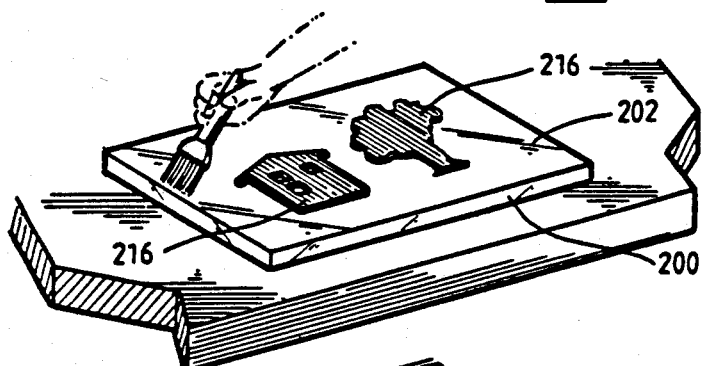
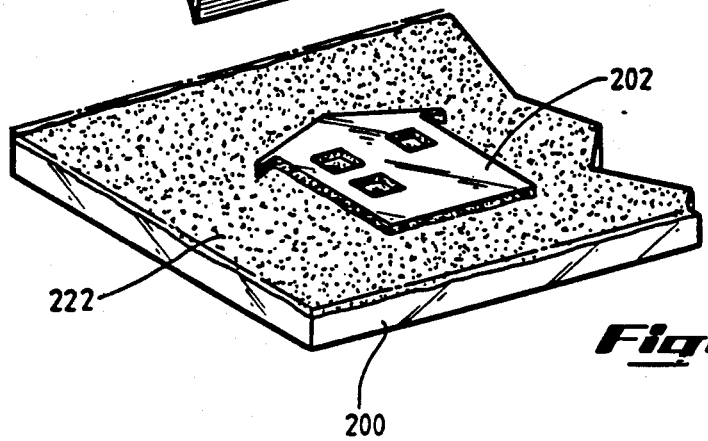

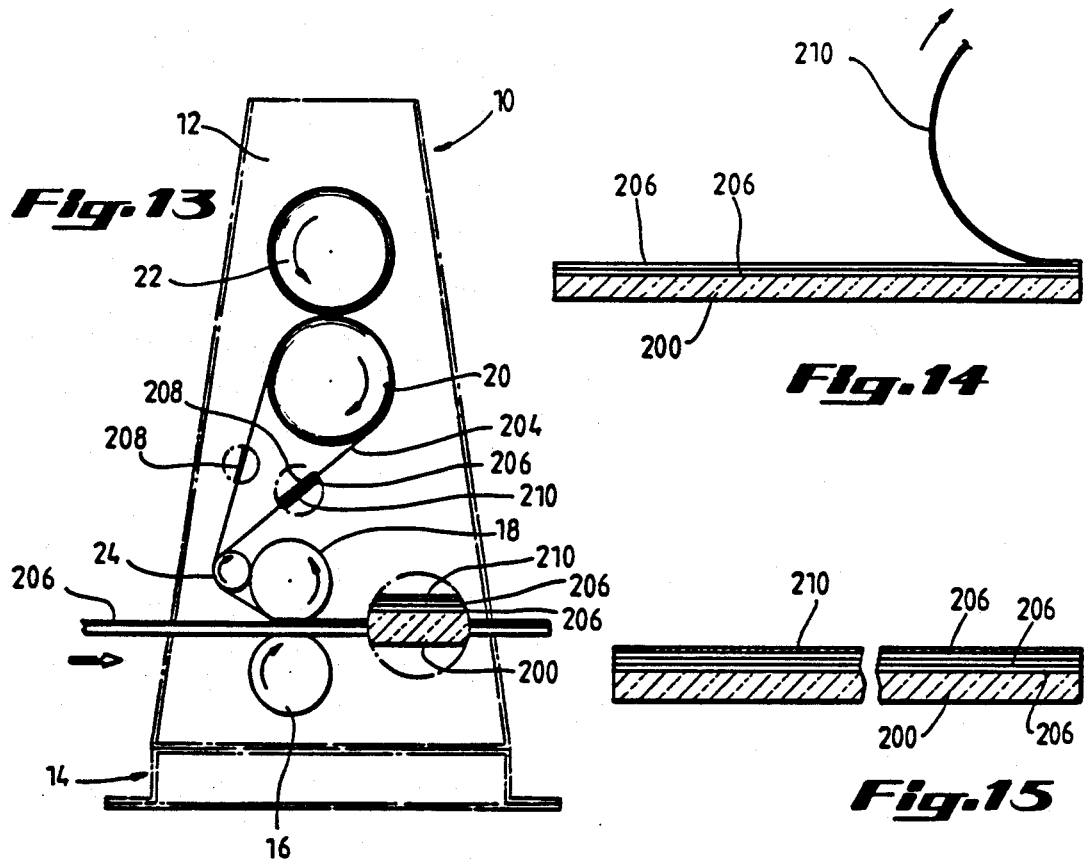
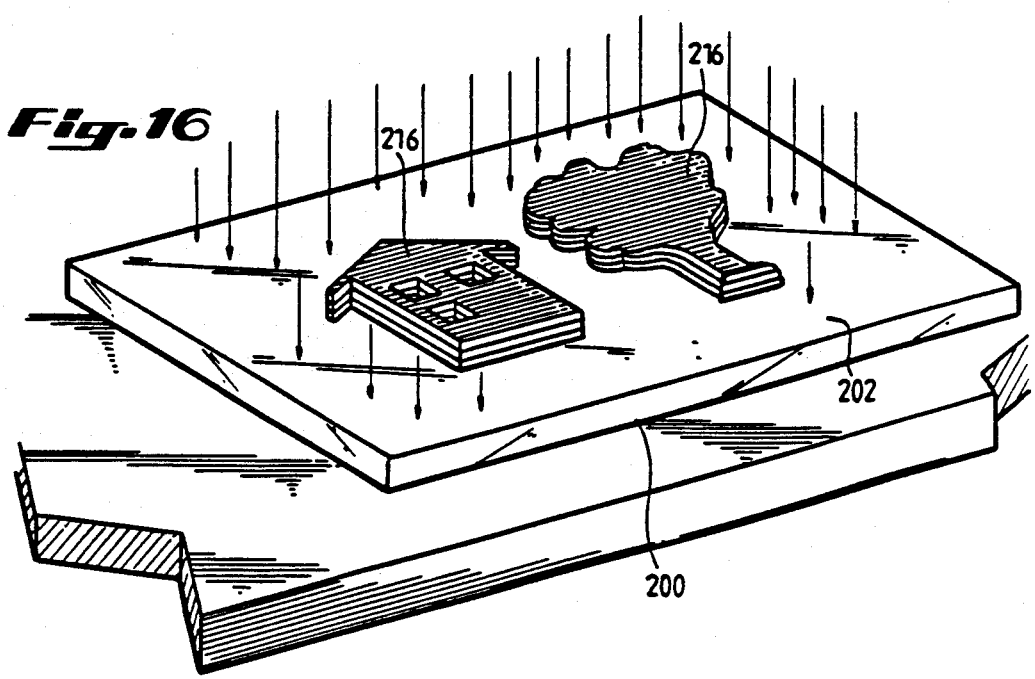

METHOD FOR CREATING A DESIGN IN RELIEF IN A HARD SMOOTH SUBSTRATE AND APPARATUS FOR USE IN THE METHOD

This is a continuation of application Ser. No. 777,243, filed Sept. 18, 1985 now U.S. Pat. No. 4,652,513 Aug. 5, 1987.

BACKGROUND OF THE INVENTION

This invention relates generally to the formation of designs in the smooth surface of a hard substrate, and more particularly to a method and apparatus used in the method to create such designs by acid etching or sand or grit blasting processes to create such designs.

The surfaces of hard material substrates, such as glass, plastic, ceramics, and marble, granite, or other stone, are often decorated with a design that is placed in the surface in relief. A portion of the surface is removed to a desired depth to create a contrast between the preexisting surface and that portion of the surface which has been removed. For glass surfaces, for example, a portion of the surface may be removed by acid etching or sandblasting. Designs in granite or marble surfaces are typically made by impacting the surface with small particles of aluminum oxide, steel shot, garnet, sand, or glass beads, a process which will hereinafter be generically referred to as sandblasting. For example, designs are placed on tombstones by this process.

Sandblasting may also be used to place designs in metals such as aluminum, brass, bronze and copper. Wood can also be sandblasted. However, the surface must first be sprayed or brushed with a clear acrylic or other sealer type paint. This gives the wood a smooth hard surface and prevents moisture from getting into the wood.

In either the acid etching or sandblasting processes, a protective mask in the shape of the desired design is applied to a portion of the surface of the substrate on which the design is to be made. The mask protects the covered portion of the surface of the substrate from the acid etchant in the case of acid etching or from the erosive particles in the case of sandblasting. That is, the surface area under the mask remains, while the acid etchant or erosive particles attack those areas of the surface unprotected by the mask, thereby removing the unprotected areas of the surface to a desired depth. The depth of removal can be varied somewhat by varying the amount of time the substrate surface is exposed to the acid etchant or erosive particles.

Current methods of acid etching or sandblasting, however, are highly labor intensive, require artistic skill, and are time consuming.

In conventional glass etching techniques, a silk screen stencil is first made and then applied to the glass surface. The silk screen has permeable and impermeable areas corresponding to the design to be placed on the surface. An acid etchant is applied to the silk screen and attacks the glass surface through the permeable areas of the silk screen. This process is explained in U.S. Pat. No. 4,436,776 to Wojcik. In addition to silk screens, stencils to etch glass have been made of plastic foil as in U.S. Pat. No. 4,316,766 to Levin et al. U.S. Pat. No. 3,769,113 to Gruenke, Jr., discloses the application of an acid resistant material, such as wax, to the glass surface to be etched.

Another technique used to decoratively etch glass uses a screenable, organic-based acid resist. The process is commonly called silk screening, but the screen materials are usually nylon, polyester, or stainless steel. The resist is heated to a liquid state and applied by screening to form a decorative pattern on the glass surface. The mask material is required to solidify over a period of time after contacting the glass. The glass article is then immersed in an acid bath. All surfaces of the glass article not covered with the resist are etched by the acid.

After the etching process is complete, the glass is rinsed with water and the mask material must then be removed. This may be done by soaking the glass in a hot solvent to soften the mask material and then washing with detergent to remove the material. Alternatively, the glass may be heated to a temperature for a period of time to burn off the mask material.

Glass, granite, marble, and other hard surfaces are commonly etched by sandblasting through a stencil having the decorative design. The stencil is usually made of a resilient material such as rubber or plasticized vinyl. The areas of the article which are to remain unetched are covered with the stencil. This method is generally disclosed in U.S. Pat. No. 1,840,226 to Chase, U.S. Pat. No. 3,687,750 to Jamieson, U.S. Pat. No. 3,515,528 to Luther et al., and U.S. Pat. No. 1,676,637 to Di Bona et al. These procedures have the inherent shortcoming of requiring the making of a separate stencil before the design can be produced in the glass or other surface.

More recently, it has been proposed to apply a liquid photosensitive resin directly to the surface to be etched by either acid etching or sandblasting. U.S. Pat. No. 4,451,329 to Batchelor et al., discloses application of an ultraviolet curable combination of acrylic oligomers, cross-linkable comonomers, and photosensitizing agents, which is rendered etchant-resistent upon cross-linking by exposure to ultraviolet radiation. The mask material is applied using existing techniques, such as screening, brushing, or spraying. Alternatively, the mask may be applied by a pad transfer technique. Either method has disadvantages. Applying a uniform thickness of liquid mask is difficult. The pad transfer technique requires the step of transferring the mask from a pad to the article which is to be etched.

U.S. Pat. No. 4,430,416 discloses use of a transfer element having a photosensitive resin for a sandblasting process. U.S. Pat. No. 4,321,105 discloses another transfer element for embossing designs by acid etching. Again, both of these techniques require transferring steps.

In view of the shortcomings of the existing methods for acid etching and sandblasting decorative designs into smooth, hard substrates, there is a need for a simpler, more economic, and faster technique for applying a mask in the desired decorative configuration to the surface of the substrate.

SUMMARY OF THE INVENTION

By means of the present invention, there is provided a method and apparatus which substantially overcomes the shortcomings of prior art methods of acid etching or sandblasting decorative designs in the smooth surfaces of hard substrates. The method involves the use of a dry film photoresist applied at ambient temperature, in the range of about 60° F. to 80° F., to the smooth surface of the hard substrate. A decorative design image is then placed on the photoresist by exposing the photoresist to ultraviolet light through a negative of the design and developing the photoresist directly on the smooth surface of the substrate. Therefore, silk screens or stencils are not needed in the process of the present invention. Also, because the exposure and development of the photoresist is accomplished directly on the substrate surface, no transfer step is required.

The present invention also provides an apparatus for applying the dry film photoresist at ambient temperature directly to the smooth surface of the hard substrate without wrinkles or pleats developing in the dry film photoresist.

The currently intended use of the dry film photoresists used in the present invention is in the printed circuit board industry to place images of circuitry onto substrates. These films have a photopolymer layer sandwiched between a polyethylene release layer and a photopolymer layer. Some of these dry film photoresists are used to etch patterns into the printed circuit board surface. They are applied at a temperature of about 200° F. so that the film flows into irregularities in the surface of the circuit board. After etching is complete, the dry film is removed.

Another particular type of dry film photoresist, called a solder mask, is preferred for use in the present invention. For their intended purpose in the circuit board industry, solder masks are designed and processed to be a permanent part of the final end product, the circuit board. The film is heated to about 200° F. during lamination onto the circuit board to obtain good flow characteristics for encapsulating raised surfaces on the circuit board. The film is then exposed to ultraviolet light to a sufficient degree (exposure energy in excess of 170 millijoules per square centimeter) to complete crosslinking of the polymers, binders and resins in the photopolymer layer of the solder mask, and the film is thereby chemically bonded to the substrate. This chemical bond makes the dry film photoresist a permanent part of the substrate, and any attempt to remove the film will usually destroy the electrical properties of the circuit board.

In the present invention these dry film photoresists are used in an entirely different manner. Unlike lamination of printed circuit boards, the dry film is applied to the smooth surface of a hard substrate such as glass without the addition of heat to soften the film. It has been found that when no heat is added, the photopolymer layer is sufficiently tacky to adhere to the smooth surface of the substrate. If heat is added to the dry film during the lamination process, however, the dry film photoresist shrinks during the cooling process and pulls away from the smooth surface of the substrate. Heating of the dry film is necessary and specified by the manufacturer for application to the uneven surface of the circuit board, but prevents the dry film photoresist from properly adhering to a smooth surface such as glass.

Because the photoresist is heated in circuit board applications, a holding time is required to let it cool before the next step of exposure to ultraviolet light. No such holding time is required in the process of the present invention because the photoresist is not heated.

Another contrast between the use of dry film photoresists in the circuit board industry and the present invention is in the amount of time and light intensity the photoresist is exposed to ultraviolet light. The photopolymer layer of the dry film responds to light energy emitted in the ultraviolet portion of the spectrum, below about 400 nanometers. Optimum exposure of the film is determined by a combination of image resolution of the negative onto the film and polymerization of the film to make the film resistant to subsequent processing. When the photoresist is exposed to ultraviolet light, it becomes hard and brittle through a process called polymerization or cross-linking.

In the circuit board industry, the photoresist is exposed to ultraviolet light so that the sidewalls of the design become hard and brittle. That is, the dry film photoresist in the circuit board industry is exposed to ultraviolet light so that complete cross-linking of the polymers occurs. This hard and brittle condition of the photoresist is undesirable in the present invention for two reasons. First, the brittleness tends to make the dry film photoresist pull away from the smooth surface of the substrate. Second, if the photoresist becomes brittle, it cannot readily withstand sandblasting.

Accordingly, the photoresist in the process of the present invention is exposed only to ultraviolet light for a period of time sufficient to define the image in the photoresist sufficiently for the development process.

In addition, in circuit board applications, a holding time of customarily about thirty minutes is required after exposing the dry film photoresist to ultraviolet light and before developing the film. This hold time permits the film to cool after the long exposure to ultraviolet light and permits some further cross-linking of the polymer in the film, and the film becomes harder. By contrast, in the process of the present invention, it is desirable that after exposure to ultraviolet light, the dry film photoresist be immediately developed to prevent hardening. This prevents the dry film photoresist from essentially becoming a permanent part of the substrate in the case of solder masks, and maintains the non-brittle, soft, tacky state of the dry film photoresist. In this state, the film better resists the action of acid etching and sandblasting.

Finally, for printed circuit board applications, a post development two step cure is specified for solder masks, a thermal step and an ultraviolet light exposure step. This curing again is undesirable in the present invention because it causes the solder mask to become hard and to become a permanent part of the substrate.

According to one embodiment of the present invention, a method is provided for forming a design in relief in the smooth surface of a hard substrate. First, the polyethylene release layer is removed from a sheet of dry film photoresist. Then the remaining protective polyester layer and photopolymer layer of the dry film photoresist are applied, without adding heat, to the smooth surface of the hard substrate with the photopolymer layer directly contacting the smooth surface. A negative of the design is placed on top of the dry film photoresist coated smooth surface. The dry film photoresist is then exposed through the transparent areas of the negative to ultraviolet light for a period of time only sufficient to place the design on the film by polymerizing only the surface of the photopolymer layer. The protective polyester layer of the dry film photoresist is then removed, leaving the photopolymer layer on the substrate. A portion of the photopolymer layer in the shape of the design is then removed from the smooth surface of the substrate by spraying with a developer solution to remove the portions of the photopolymer layer which were behind the dark portions of the negative during exposure to ultraviolet light. Next, the smooth surface of the hard substrate is removed to a desired depth over the area of the smooth surface where the photopolymer layer has been removed. Finally, the remaining portion of the photopolymer layer is removed, leaving the finished product.

In another embodiment of the method, the photopolymer layer is developed without delay following exposure to ultraviolet light.

In a further embodiment of the method, the smooth surface of the hard substrate is removed by applying an acid etchant.

In still another embodiment of the method, the smooth surface of the hard substrate is removed by impinging hard particles against the surface.

In a yet further embodiment, the dry film photoresist is a solder mask, and the solder mask is not cured after development.

In yet another embodiment of the method of the present invention, when the smooth surface of the hard substrate is removed by impinging hard particles against the surface, multiple layers of the solder mask may be built up on the smooth surface of the substrate to permit removal of the smooth surface to a desired depth. By building up the layers, particles may be impinged against the surface for a longer period of time to remove the surface to a greater depth.

In still another embodiment of the method of the present invention, the remaining layers of the dry film photoresist after the polyethylene release layer has been removed are applied to the smooth surface of the hard substrate by running the hard substrate and remaining layers between pressure rollers. The remaining layers of the dry film photoresist are held in tension before entering between the pressure rollers to substantially eliminate the problem of wrinkles developing in the film as it is laminated to the hard substrate.

The present invention also provides an apparatus for applying a dry film photoresist to the smooth surface of the hard substrate. The apparatus has means for removing the polyethylene release layer from the dry film photoresist, means for applying the remaining layers of the dry film photoresist under slight pressure and without adding heat to raise its temperature to the smooth surface of the hard substrate with the photopolymer layer of the dry film photoresist directly contacting the smooth surface, and means for tensioning the dry film photoresist before it is applied under slight pressure to the smooth surface.

In another embodiment, the apparatus has a pair of rotatable feed rollers having deformable surfaces. At least one of these feed rollers is positively driven. The feed rollers are parallel to each other and movable toward and away from each other for accepting the dry film photoresist and substrate therebetween. Means are provided for adjusting the maximum spacing between the feed rollers to accommodate the thickness of the substrate. Means are also provided for rotatably mounting a supply roll of dry film photoresist spaced from and parallel to the feed rollers for supplying the dry film photoresist to the feed rollers. Means are also provided for rotatably mounting a take-up roll parallel to the supply roll for taking up the polyethylene release layer of the photoresist as the polyethylene release layer is separated from the dry film photoresist. The take-up roll rides on the supply roll. Means are also provided for tensioning the dry film photoresist before it enters between the feed rollers.

In a further embodiment of the apparatus, the tensioning means is an anti-pleater roller parallel to the feed rollers and positioned along the path of travel of the dry film photoresist between the supply roll and the feed rollers. The anti-pleater roller contacts the dry film photoresist and rotates in a direction opposite the direction of travel of the photoresist from the supply roll to the feed rollers.

It is therefore an advantage of the present invention that a method and apparatus are provided for applying a dry film photoresist to a smooth, hard substrate without wrinkles or pleats.

It is another advantage of the present invention that a method and apparatus are provided for applying a dry film photoresist without heat to a smooth hard substrate, such as glass, plastic, polished marble, polished granite, ceramics, metals or acrylic coated wood so that the dry film photoresist does not pull away from the surface of the substrate after application.

It is a further advantage of the present invention that the need for making stencils to produce the desired decorative design in the smooth surface of hard substrates is eliminated.

Yet another advantage of the present invention is that a dry film photoresist is used instead of liquid photoresists which are more difficult to handle and apply, require a higher initial equipment outlay, and require greater production time. The dry film photoresists used in this invention are fully aqueous, whereas liquid photoresists are solvent based and require use of solvents for development and stripping.

A yet further advantage of the present invention is that it permits the use of dry film photoresist currently used in the circuit board industry in the acid etching or sandblasting of hard, smooth surfaced substrates, such as glass, plastics and ceramics, and in sandblasting of granite, marble and other stones, metals, such as aluminum, brass, bronze and copper, and acrylic coated wood.

Still another advantage of the present invention is that chemical etching or sandblasting can be used to create the design in the substrate.

A still further advantage of the process of this invention is that it accomplishes high resolution (to about 0.010 inch diameter detail) etching.

BRIEF DESCRIPTION OF THE DRAWINGS

FIG. 3 is a detailed perspective view in partial section of the take-up roll assembly of the laminator.

FIG. 4 is a side view of the supply roll, anti-pleater roller, and feed rollers during lamination of a substrate.

FIG. 5 is a detail view in partial section and partially exploded of the adjustment machanisms of the upper feed roller of the laminator.

FIG. 6 is a partial front elevational view of the laminator.

FIG. 7 is a schematic diagram of the lamination step of the process of the present invention showing a dry photoresist being applied to a substrate.

FIG. 8 is a schematic diagram showing a laminated substrate being exposed to ultraviolet light through a photographic negative.

FIG. 9 is a schematic diagram showing the outer protective polyester layer of the dry film photoresist being removed preparatory to developing the remaining photopolymer layer.

FIG. 10 is a schematic diagram of the development step of the process.

FIG. 11 is a schematic diagram showing a portion of the photopolymer layer in the shape of the design remaining after development and during application of an acid etchant.

FIG. 12 is a schematic diagram showing the etched substrate surface after the remaining photopolymer layer has been stripped.

FIG. 13 is a schematic side elevational view through the laminating machine showing multiple layers of a solder mask being applied to a substrate.

FIG. 14 is a schematic diagram showing the protective polyester layer being removed preparatory to laminating a third solder mask layer to the substrate.

FIG. 15 is a schematic sectional view through a substrate having multiple layers of solder mask thereon.

FIG. 16 is a schematic diagram showing sandblasting of a substrate portion of which is protected by multiple layers of solder mask.

DETAILED DESCRIPTION OF THE PREFERRED EMBODIMENTS

Figure 1:
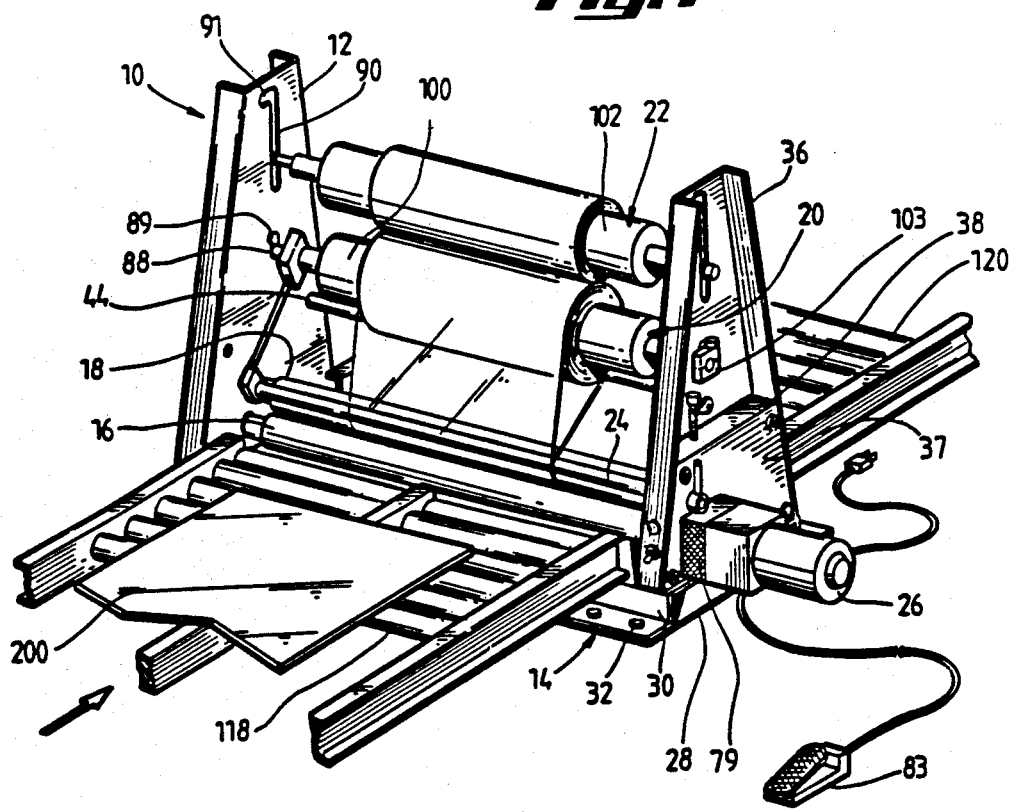
FIG. 1 is a perspective view of a laminator constructed in accordance with the present invention.
Figure 2:
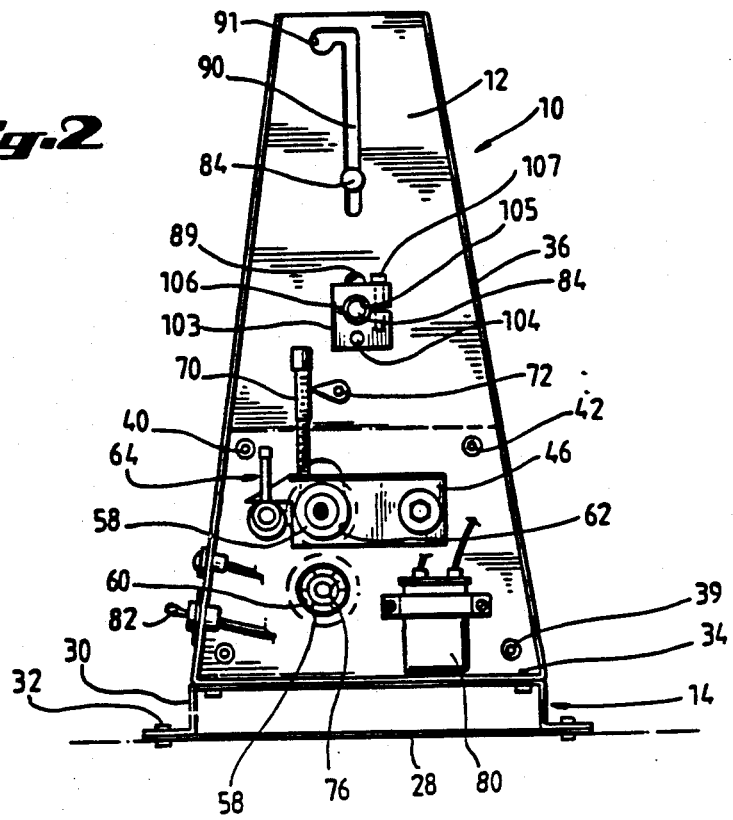
FIG. 2 is a side elevated view of the laminator with the end bell cover shown in phantom.

One feature of the present invention is a device for applying or laminating a dry film photoresist onto the smooth surface of a hard substrate such as glass, plastic, ceramic, granite, marble, metal or acrylic coated wood. As best seen in FIGS. 1 and 2, laminator 10 is generally made up of a pair of end bells 12 in the shape of truncated triangles which are bolted to a base 14, a lower driven feed roller 16 extending between the end bells, an upper undriven feed roller 18 extending between the end bells, a dry film photoresist roll assembly 20 extending between the end bells, a take-up roll assembly 22 extending between the end bells, an anti-pleater roller 24 positioned to ride against upper feed roller 18, and a motor 26 to drive the lower feed roller 16. The laminator may be constructed in different widths to handle different sizes of substrate.

Base 14 is made up of a lower stainless steel plate 28 with an upper formed stainless steel plate 30 bolted thereto by a plurality of nuts and bolts 32. Formed stainless steel plate 30 provides rigidity to the base.

Each end bell 12 is bolted to upper plate 30 by a plurality of bolts 34 threaded into apertures in upper plate 30 of the base and in a bottom flange 35 of end bell 12. Each end bell 12 also has side flanges 36. The bottom flanges and side flanges provide rigidity for the end bells.

Each end bell 12 has an end bell cover 37 positioned thereon which covers the lower portion of each end bell. Each cover 37 has an inwardly extending upper flange 38. Each cover 37 is held in spaced relationship from its corresponding end bell 12 by four spacer washers 39. Three of these spacer washers are mounted on a nut and bolt 40 which extends through apertures in the end bell 12 and cover 37 to hold the cover in place. The other spacer washer 39 is mounted on a bolt 42 extending first through an aperture in the cover, then the end bell, and then threads into a spacer bar 44 which extends between the end bells. Spacer bar 44 provides rigidity to end bells 12.

Pivotally mounted on each end bell is an upper feed roller pivot bracket 46 as seen in FIGS. 2 and 5. Each bracket 46 is mounted on a pivot button 48 and bolt 49. The pivot button is mounted in an aperture in bracket 46, and bolt 49 extends through button 48 and through an aperture in end bell 12. A triangular extension plate 50 extends from each bracket 46, the purpose of which will be described below.

Lower and upper feed rollers 16, 18 are generally of the same construction. Each roller 16, 18 has a solid inner stainless steel shaft 52 with an elastomeric covering 54 mounted thereon. Elastomeric covering 54 is preferably made of natural rubber with a durometer hardness of about 33. This permits rollers 16, 18 to deform somewhat during the lamination process. It has been found that feed rollers 16, 18 function best when rubber coverings 54 are provided with a slope as shown in FIG. 6. For rollers about 2-4 feet long and with a covering outside diameter of about 2 inches, the surface of the rubber covering is sloped with an outside diameter at the center which is about 0.020 inches larger than the diameter at the opposed ends of the rubber covering. This slope aids in the substrate and dry film photoresist passing between rollers 16, 18 in a straight line during the lamination process.

As shown in FIGS. 2 and 5 each feed roller 16, 18 has opposed end extensions 56 that ride in roller bearings 58. Roller bearings 58 for lower feed roller 16 are mounted in apertures 60 in end bells 12. By contrast, roller bearings 58 for upper feed roller 18 are mounted in apertures 62 in pivot brackets 46. Upper feed roller 18 at its opposed ends passes through a vertial slot 63 in each end bell 12.

Upper feed roller 18 may be lifted out of contact with lower feed roller 16 by actuating levers 64, which lift pivot brackets 46. Each lever 64 is mounted in an aperture in its respective end bell 12 and cover 37. An intermediate camming surface 66 of the lever engages triangular extension plate 50 on bracket 46 by turning lever handle 68. During laminating operation of laminator 10, camming surface 66 is disengaged from triangular extension plate 50 so that upper feed roller 18 rests against lower feed roller 16. However, when laminator 10 is not in use, it is preferable to engage camming surface 66 against extension plate 50 to lift upper roller 18 out of contact with lower roller 16. This prevents the rubber coverings on rollers 16, 18 from developing flat spots when the laminator is not in use.

It is desirable to control the maximum amount of spacing between lower and upper rollers 16, 18 during the lamination process so that varying thicknesses of substrate can be laminated with a dry film photoresist while maintaining an even amount of pressure on the substrate and photoresist as they pass between the rollers. In the case of a laminator used to laminate dry film photoresist onto a glass substrate, for example, it is desirable that the feed roller 16, 18 be able to accommodate glass thicknesses of from 3/32 inch to at least ½ inch. By contrast, circuit boards are at most about ¼ inch thick and are today being made thinner and thinner.

Adjustment of the feed rollers is accomplished in laminator 10 by provision of an adjustment screw 70 which is threaded into an aperture in flange 38 of each bell cover 37. The lower end of each adjustment screw 70 extends downwardly below flange 38 to a point in close proximity to the flange of pivot bracket 46. Adjustment screw 70 at its upper end has graduations 71 for registration with a pointer 72 fixedly mounted on end bell 12 by a bolt 73. Graduations 71 are placed at predetermined spacings to indicate various substrate thicknesses, for example, 3/16 inch, ⅜ inch, etc. Adjustment screw 70 can be turned to advance it into or back it out of the aperture in flange 38 so that pointer 72 points to graduation mark 71 corresponding to the substrate thickness to be laminated.

When the substrate and dry film photoresist are run through feed rollers 16, 18, upper feed roller 18 moves upwardly on pivot bracket 46, but its upward travel is restricted by the lower end of adjustment screws 70 contacting the flange on each pivot bracket 46. The maximum distance between rollers 16, 18 is thereby set for a particular substrate thickness to provide control for the amount of pressure applied by rollers 16, 18.

In addition to the other features previously described for upper and lower feed rollers 16, 18, lower driven feed roller 16 at one end has an extension 74 with a keyway. This extension 74 extends beyond roller bearing 58 for mounting one coupling jaw 76. Coupling jaw 76 has a slot which matches keyway. A mating coupling jaw 78 (shown only in FIG. 6) is mounted on motor 26 which drives lower feed roller 16. Motor 26 is a continuous duty, permanent split capacitor gear motor, such as a Dayton model no. 4Z062 motor. As shown in FIGS. 1 and 6, motor 26 is mounted on a bracket 79 which is in turn mounted on end bell cover 37. Both end bell cover 37 and bracket 79 have an aperture therethrough for coupling jaw 78. Associated with the motor is a capacitor 80 mounted in the space between end bell 12 and cover 37 and a power switch 82 mounted on a side flange 36 (shown in FIG. 2). Preferably, laminator 10 is provided with a foot control 83 to control power to motor 26 so that the laminator operator's hands are free to feed the substrate into the laminator.

Supply roll assembly 20 and take up roll assembly 22 are both of generally the same construction. Take-up roll assembly 22 is shown in FIG. 3. Assemblies 20, 22 each have opposed ends 84 with a reduced diameter section 86 thereon. Reduced diameter sections 86 of supply roll assembly 20 are dimensioned to fit in a lower slot 88 (shown in FIG. 1) in each end bell 12. The upper end of each slot 88 opens into a larger diameter portion 89 which has a larger diameter than ends 84 of assembly 20. This permits supply roll assembly 20 to be removed from laminator 10 when it is necessary to replace the supply of dry film photoresist by simply aligning ends 84 with larger diameter portions 89.

Similarly, an elongated upper slot 90 is provided in each end bell 12 for receiving reduced diameter sections 86 of ends 84 of take-up roll assembly 22. At the upper end of upper slot 90 and offset therefrom is a larger diameter portion 91 which has a larger diameter than the outside diameter of ends 84 of take-up roll assembly 22. Take-up roll assembly 22 during operation of laminator 10 is normally in contact with and rides on supply roll assembly 20 as shown in FIGS. 1 and 7. Take-up roll assembly 22 can easily be moved out of contact with supply roll assembly 20 by sliding assembly 22 upwardly through slot 90 and then resting it in larger diameter portion 91. Take-up roll assembly 22 can also be removed from laminator 10 by the same procedure as described above for removal of supply roll assembly 20.

Extending inwardly from ends 84 of assemblies 20, 22 are mounting spools 92. A tube 94 extends between mounting spools 92 and is shrunk-fit thereon. Tube 94 of supply role assembly 20 is preferably of a larger diameter than tube 94 of take-up roll assembly 22 because of the greater weight which must be supported by supply roll assembly 20.

Mounted on each tube 94 is a pair of opposed spool hubs 96 each of which is held in place by a set screw 98 which can be tightened down into contact with tube 94 to fix the position of the spool hubs. Extending between spool hubs 96 of supply roll assembly 20 is a supply spool 100 of dry film photoresist. Mounted on spool hubs 96 of take-up roll assembly 22 is a take-up spool 102 for collecting the polyethylene release layer of the dry film photoresist as it is separated therefrom.

As shown in FIG. 2, supply roll assembly 20 may be provided with a slotted friction plate 103 mounted on an end bell 12 by a bolt 104. End 84 of the supply roller assembly extends into an aperture 105 in plate 103 which has a Teflon bushing 106 positioned therein. The slot in plate 103 permits the plate to be clamped down on end 84 by tightening a bolt 107. Rotation friction of supply roll assembly 20 can thereby be adjusted so that the assembly does not turn faster than feed rollers 16, 18 that pull the dry film off of supply spool 100.

Anti-pleater roller 24 is preferably made of polished stainless steel. As shown in FIG. 4, roller 24 is supported at its opposite ends by brass mounting plates 108 each of which is threaded onto the lower end of a stainless steel rod 109. A lock nut 110 fixes the position of each plate 107 on rods 109.

The upper end of each rod 109 is threaded into an aluminum mounting bracket 114 which is mounted on tube 94 of supply roll assembly 20. A lock nut 116 again fixes the location of rod 109 relative to bracket 114. Brackets 114 are rotatably mounted on tube 94 so that anti-pleater roller 24 can be pivoted away from upper feed roller 1B. During the lamination process, however, anti-pleater roller 24 rests under its own weight against upper feed roller 18.

As can be seen in FIG. 4, during the lamination process, feed rollers 16, 18 are deformed where they contact the substrate and solder mask. For example, in laminating a ½ inch substrate, feed rollers 16, 18 having about a 1 inch radius may be compressed to a radius of about ⅞ inches at the point of contact with the substrate and solder mask.

In the absence of an anti-pleater roller 24, this difference in radius of upper feed roller 18 causes the solder mask to be fed onto the substrate at a slower rate than the take-off rate of the solder mask from supply spool 100. Pleats or wrinkles would form in the solder mask as it moves around upper feed roll 18. Wrinkles or pleats could also be developed in the solder mask if a sudden change in the substrate thickness occurred, such as when successive pieces of substrate are fed through laminator 10 which have different thicknesses.

Anti-pleater roller 24 substantially eliminates the problem of wrinkles or pleats developing in solder mask 204 as it is laminated onto the substrate 200. As shown in FIG. 4, anti-pleater roller 24 rides against upper feed roller 18 and thus rotates in a direction opposite to upper feed roller 18 and opposite to the direction of travel of the solder mask. This opposite rotation of anti-pleater roller 24 creates a slight pull or tension in the solder mask 204 between anti-pleater roller 24 and upper feed roller 18. This tension should be sufficient to prevent pleats or wrinkles from forming in the solder mask.

It has been found that an anti-pleater roller which has a radius 0.375 times the radius of upper feed roller 18 is a size which provides adequate tension in the solder mask to prevent wrinkles or pleats.

To assist in feeding the substrate to be laminated into rollers 16, 18 of laminator 10 and to facilitate the removal of the laminated substrate from the rollers, a set of entrance conveyor rollers 118 and a set of exit conveyor rollers 120 are provided as shown in FIG. 1. The tops of conveyor rollers 118, 120 are even with the top of lower feed roller 16.

Laminator 10 operates as follows. A spool 100 of dry film photoresist 204 is installed between spool hubs 96 of supply roll assembly 20. Set screws 98 are tightened to fix the location of spool hubs 96 on tube 94. Spool 100 is mounted so that the leading edge of dry film photoresist 204 is positioned as shown in FIG. 7. Dry film photoresist 204 for the process of the present invention is preferably a solder mask which is normally used in printed circuit boards. Such a solder mask is sold on spools by Dynachem Corporation under the trademark Laminar FM. Solder mask 204 has three layers, a dry film photopolymer layer 206 sandwiched between a polyethylene release layer 208 and a polyester support layer 210.

After the roll of dry film photoresist 204 is mounted in laminator 10 as described above, a short length of the solder mask is unwound from supply spool 100, and polyethylene release layer 208 is separated from photopolymer layer 206. With the take-up roll assembly 22 in the upper larger diameter portion 91 of slot 90, polyethylene layer 208 is wrapped around take-up spool 102 in the direction shown in FIG. 7. Take-up roll assembly 22 is then lowered down slot 90 and into contact with supply roll assembly 20. When supply spool 100 rotates to feed off the dry film, take-up spool 102 rotates in the opposite direction to take up a comparable length of polyethylene release layer 208.

The remaining photopolymer layer 206 and protective polyester layer 210 of the solder mask are then threaded over anti-pleater roller 24. Laminator 10 is now ready to laminate the solder mask photopolymer layer and polyester layer onto a smooth surface 202 of a substrate 200.

During the above procedures, upper feed roller 18 should be out of contact with lower feed roller 16 by engaging camming surface 66 of levers 64 with extension plates 50 on pivot brackets 46. It is necessary that both adjustment screws 70 be backed out of the aperture in flange 38 of each bell cover 37 sufficiently so that pivot brackets 46 are free to pivot upwardly without contacting the lower end of adjustment screw 70.

It is important that before lamination begins, smooth surface 202 of the substrate be thoroughly cleaned. Any residue, such as oil or fingerprints, remaining on smooth surface 202 of the substrate may adversely affect the adhesion of the solder mask to the substrate. For cleaning a glass substrate, a suitable cleanser is Signature Liquid Cleanser sold by Vacuum Applied Coatings Corporation. The glass is cleaned with several drops of the cleanser and water. The glass can then be dried with unused newsprint to remove all residue.

To begin the laminating process, the leading edge of solder mask 204 is positioned between feed rollers 16, 18 and lever 64 is rotated so that upper feed roller 18 is brought down into contact with lower feed roller 16. Solder mask 204 can now be threaded between rollers 16, 18 by turning on motor 26 to drive lower feed roller 16. Adjustment screw 70 should be set so that the graduation mark 71 corresponding to the thickness of the substrate to be laminated is lined up with pointer 72. With the solder mask threaded between rollers 16, 18, polyethylene release layer 208 should separate from photopolymer layer 206 of the solder mask at a point about tangent to the anti-pleater roller 24 as shown in FIG. 7. Substrate 200 is now placed on entrance conveyor rollers 118 and with its leading edge positioned evenly along feed rollers 16, 18. By gently pushing the substrate and simultaneously powering lower feed roller 16 with foot control 83, substrate 200 will be pulled through rollers 16, 18 and solder mask 204 will be laminated to the smooth surface 202 of the substrate with photopolymer layer 206 directly contacting the smooth surface. After the laminated substrate has passed through the rollers, solder mask 204 trailing behind the laminated substrate can be cut free from the substrate.

Adjustment screw 70 sets the maximum distance between lower and upper feed rollers 16, 18 so that only pressure sufficient to prevent the formation of air bubbles between the solder mask and substrate is placed on solder mask 204 and substrate 200. Unlike conventional laminators used for applying solder masks or other dry film photoresists to circuit boards, such as the Model 300 Laminator sold by Dynachem Corporation, laminator 10 does not heat up the solder mask during the lamination process. Dynachem Corporation's Model 300 Laminator, for example, has internally heated rollers to heat the laminate to a recommended temperature of about 200° F. for application to printed circuit boards. At this temperature, the solder mask softens to some extent so that it can flow into irregularities in the surface of the circuit board to which it is being applied.

Such heating of the solder mask is detrimental to the process of the present invention in which the solder mask is being applied to a very smooth substrate surface. If the solder mask is heated during the lamination process, as it cools, it will shrink and pull away from the smooth substrate surface because of shrinking. This is not a problem in circuit board applications because circuit boards have rough surfaces providing irregularities which the solder mask can "grab" onto. In the process of the present invention, therefore, the dry film photoresist should be applied at ambient temperature, a range that does not change its properties. Such a temperature range is about 60°-80° F.

Because the dry film is not heated for lamination to the substrate in the process of this invention, there is no need to hold the laminated substrate for a cooling period before proceeding with the next process step. Such a cooling period is required in circuit board lamination processes.

After solder mask 204 has been laminated onto the smooth surface 202 of substrate 200, an image can be placed in the photopolymer layer 206 of the solder mask. This is done by placing on top of the laminated substrate a photo tool, commonly known as artwork, negative, or film, which carries the image or decorative design in negative to be transferred onto substrate 200. Typically, this photo tool may be a photographic negative 211 as shown in FIG. 8. The photographic negative has dark, emulsified areas 212 and transparent unemulsified areas 213. Ultraviolet light can pass through the unemulsified areas 213 to the photopolymer layer 206 below.

As shown in FIG. 8, an ultraviolet light source 214 is positioned above negative 211 and the laminated substrate. One apparatus which may be used for this process is, for example, a mercury exposure unit model 40-1k manufactured by nuArc Company, Inc. The nuArc mercury exposure unit has a vacuum glass frame which can pull a vacuum so that negative 211 is held tight and flat against polyester layer 210. For smaller and more intricate designs, it is preferable that a vacuum be used to assure this tight contact for best resolution of the design. However, use of equipment which can provide a vacuum is not essential. Indeed, for very large pieces of substrate, commercially available exposure units such as the nuArc mercury exposure unit, are not large enough. To ensure a tight contact between negative 211 and polyester layer 210, another piece of glass can be placed on top of the negative. In any event, negative 211 is placed on the polyester layer with the emulsion side (less shiny) facing down in contact with the polyester layer.

Ultraviolet light source 214 is then activated to expose those portions of photopolymer layer 204 which lie behind transparent portions 213 of negative 211. The exposure time to the ultraviolet light is only long enough to produce a distinguishable image in photopolymer layer 206. Exposure time is the most common parameter used to control the amount of polymerization of the photoresist. The exposure time necessary to reach a specific degree of polymerization depends upon the light intensity and exposure time. Light intensity can vary with lamp age, type and voltage. Exposure energy E is the product of the lamp intensity I and the exposure time t. E is customarily expressed in millijoules per $cm^2$, I in milliwatts per $cm^2$, and t in seconds.

During exposure of the solder mask to ultraviolet light, cross-linking of the photosensitive monomers, polymers and resins in the dry film takes place. In the circuit board industry, total cross-linking or polymerization is required, that is, polymerization of the entire thickness of the photopolymer layer down to the substrate. For example, Dynachem's solder mask requires exposure energy in excess of 170 millijoules per $cm^2$ for such complete cross-linking through the entire thickness of the photoresist. Cross-linking at the substrate level also initiates a chemical reaction that complexes the solder mask with the substrate typically used in circuit boards. Such chemical complexing is not desired in the process of the present invention because the dry film photoresist must be removed from the substrate after completion of the acid etching or sandblasting step.

Accordingly, the process of this invention requires very low exposure, typically 3 to 25 millijoules per $cm^2$, so that complete cross-linking does not occur and so that only the image is transferred onto the surface of the photoresist. The lower exposure is needed so that the desired image (exposed area of the photoresist) withstands the development step but leaves the thickness of the photoresist under its upper surface in a nonpolymerized state, a rubbery state which is particularly important in withstanding the effects of sandblasting. In this condition, the dry film photoresist photopolymer layer has a top polymerized crust which protects the unpolymerized thickness of the photopolymer layer immediately below from the action of development solution during the development process.

For example, exposure time for a nuArc model 40-1K mercury exposure unit is about a minute or less to polymerize only the surface of the photoresist and place the image thereon. Again, exposure should not be as long as recommended by the manufacturer of the solder mask for circuit board applications because such exposure will cause complete or nearly complete cross-linking of the polymers in the photopolymer layer. Such complete cross-linking causes the photopolymer layer to become brittle, and this is undesirable for further processing steps in the etching of substrates having smooth surfaces. Particularly, if the solder mask becomes brittle, it may tend to pull away from the smooth surface of the substrate. Also, if the solder mask becomes brittle, it will not act as an effective mask, especially against subsequent sandblasting which requires a mask having some resilience.

The low energy exposure to ultraviolet light used in the process of the present invention would be unacceptable in the circuit board industry because it would produce unacceptable sidewalls in the photopolymer layer of the resist after the development step. Such sidewalls are acceptable in the present process because tolerances in the decorative etching process of this invention are not nearly as close as those used in the circuit board industry.

Because cross-linking of the polymers continues even after exposure to the ultraviolet light ceases, it is desirable that the development process follow immediately after exposure. As shown in FIG. 9, protective polyester layer 210 is first carefully peeled off, leaving only photopolymer layer 204 on substrate 200. In FIG. 9, image 216 on photopolymer layer 206 is the area which was exposed to the ultraviolet light source 214. Portion 218 of photopolymer layer 206 was behind emulsified part 212 of negative 211 and was not exposed to the ultraviolet light source 214.

After peeling off the polyester layer, the laminated substrate is then placed in a development chamber 220 shown in FIG. 10 for application of a developer solution as is well known to those skilled in the art. Preferably, the developer solution is made up of sodium carbonate powder mixed with water. The developer solution is applied to the laminated substrate positioned in development chamber 220 by spraying the entire photopolymer layer coated surface of substrate 200 with the developer solution. Preferably, for solder masks, development chamber 220 is heated to about 105° F. (should not exceed about 115° F.) for the development process. Portion 218 of photopolymer layer 206 is removed by the developer solution, and spraying should continue until all of portion 218 is removed.

Following the development process, the substrate should be sprayed with water to wash off all developer solution on both the front and back of the substrate. Complete removal of the developer solution stops the development action. The substrate can then be dried with unused newsprint. Unlike the procedure used in applying a solder mask to printed circuit boards, there is no need at this point to hold substrate 200 with the remaining image portion 216 of photopolymer layer 206 for a curative period. For printed circuit board applications, the solder mask is cured so that it hardens and becomes a permanent part of the circuit board structure. Dynachem Corporation, for example, recommends a two stage cure, a thermal cure followed by exposure to ultraviolet light.

This is totally undesirable in the process of the present invention for two reasons. First, the solder mask must eventually be removed from the substrate, so there is no desire for it to become an integral part of the substrate. Second, it is undesirable for the solder mask to cure and become hard if sandblasting is to be used as the etching process. A brittle solder mask will not adequately hold up against sandblasting. Rather, the solder mask should remain soft, pliable, and tacky to best resist the action of sandblasting.

Next, if an acid is used to etch the surface of the substrate, the acid may be applied in the form of a paste as shown in FIG. 11 or by dipping the laminated substrate in a tank containing an acid solution. In either case, portion 216 of photopolymer layer 206 remaining on substrate surface 202 protects that portion of the substrate surface from attack and corrosion by the acid solution. The substrate is left exposed to the acid for a period of time sufficient to obtain the desired depth of substrate surface removal. Removed portion 222 of the substrate is shown in FIG. 12. Preferably, the acid etching solution is an ammonium bifluoride solution. Hydrofluoric acid may also be used.

Following the acid etching step, the substrate should be placed in another chamber (not shown) similar to development chamber 220 and thoroughly rinsed with water to remove the acid solution. Finally, the substrate is placed in a stripper chamber and sprayed with a stripper solution to remove portion 216 of photopolymer layer 206. The stripper chamber (not shown) again is similar to development chamber 220. Preferably, for solder masks, the stripper chamber is heated to about 120° F. (not to exceed about 130° F.) for the stripping process. The stripper is preferably a solution of potassium hydroxide (potash lye) in water. After all of portion 216 of photopolymer layer 206 has been removed, the substrate should again be thoroughly rinsed with water and dried with newsprint. The finished product with all of photopolymer layer 206 removed is shown in FIG. 12.

It has been found that a solder mask dry film photoresist works best in the process of acid etching in accordance with the present invention. However, other types of dry film photoresist may be used with success in acid etching. For example, dry film photoresists sold by Dynachem Corporation under the trademarks Laminar TR and Laminar HG have been used with success. Solder mask dry film photoresist, however, is preferred because of its better adherence to the smooth substrate surface.

Instead of the acid etching step described above, the design may be etched in the substrate surface by a sandblasting process. Particles of aluminum oxide, steel shot, garnet, sand, and glass beads are among the types of materials that may be used in the sandblasting process. As is well known to those skilled in the art, such particles are directed at the substrate surface under pressure to impinge on the surface and erode away the surface of the substrate to a desired depth. The portion of the surface masked by photopolymer portion 216 is protected from the particle impingement.

Because of their chemical properties and commercially available thicknesses, solder masks, rather than other types of dry films, are preferrably used in the process of this invention when sandblasting. However, it has been found that a thickness of mask is required for sandblasting which is even greater than the thickness of commercially available solder masks. For example, the thickest solder mask available from Dynachem Corporation has a photopolymer layer of 3 mils or 4 mils thick (other types of dry films are available only in thicknesses of about 1.5–3.0 mils). This thickness has proven entirely inadequate to stand up against sandblasting for a period of time to obtain a sufficient design depth in the substrate. Therefore, it is necessary to provide multiple layers of the solder mask on the substrate in order to provide sufficient protection against the effects of sandblasting for the period of time sufficient to get adequate erosion of the substrate surface. For example, it has been found that two layers of 3 mil thick photopolymer layer, or a total of 6 mils thickness is sufficient for light sandblasting of glass and plastic. Four layers or about 12 mils thick of photopolymer layer is necessary for sandblasting of marble to a depth of about 5/32 of an inch.

Multiple solder mask layers can be applied to a substrate with laminator 10 as shown in FIG. 13. After substrate 200 has been laminated with a solder mask 204 as previously described, the laminated substrate is put back through laminator 10 to apply a second layer of solder mask on top of the existing layer. Before the laminated substrate is put back through laminator 10, however, protected polyester layer 210 of the solder mask is removed, leaving only photopolymer layer 206 on the substrate. When the laminated substrate 200 is then run back through laminator 10, the second solder mask layer 204 is applied so that its photopolymer layer 206 directly contacts the photopolymer 206 of the solder mask already on the substrate. Additional layers of solder mask can be applied, each time removing the polyester layer 210 from the uppermost layer of solder mask on the substrate as shown in FIG. 14, and then running the laminated substrate back through laminator 10. The resulting product as shown in FIG. 15 has multiple photopolymer layers 206 thereon with a top protective polyester layer 210 which remains on the laminated substrate through the exposure step.

The multilaminated substrate shown in FIG. 15 is then subjected to the exposure and development steps previously described before the final sandblasting step as shown in FIG. 16. Although the solder mask will erode away during the sandblasting to a certain extent, the solder mask is built up to a sufficient depth so that it will not wear away completely down to smooth surface 202 of the substrate before the sandblasting step is completed. If the solder mask begins to dry out during the sandblasting process, water can be applied to restore its resiliency.

After the sandblasting step, the remaining solder mask is removed by spraying a stripper solution thereon as previously described.

It has been found that even as the thickness of the solder mask is increased by placing multiple layers of it on the substrate, no additional amount of energy is required to expose the solder mask to ultraviolet light to place the design on its surface. However, the time to develop the photopolymer layers 206 so that areas 218 are completely removed from the substrate surface increases as the thickness of the photopolymer layer increases.

The foregoing description has been directed to particular embodiments of the invention in accordance with the requirements of the patent statute for the purpose of illustration and explanation. It will be apparent, however, to those skilled in this art that many modifications and changes in the apparatus and method set forth will be possible without departing from the scope and spirit of the invention. It is intended that the following claims be interpreted to embrace all such modifications and changes.

What is claimed:

1. An apparatus for applying a dry film photoresist to the smooth surface of a hard substrate comprising:
   (a) means for removing the polyethylene release layer from the dry film photoresist;
   (b) means for applying the remaining layers of the dry film photoresist under slight pressure, and at ambient temperature, to the smooth surface of the hard substrate with the photopolymer layer of the dry film photoresist directly contacting the smooth surface; and (c) means for tensioning the dry film photoresist before it is applied under slight pressure to the smooth surface.

2. An apparatus for applying a dry film photoresist to the smooth surface of a hard substrate comprising:
(a) a pair of rotatable unheated feed rollers having deformable surfaces, at least one of the feed rollers being positively driven, the feed rollers being parallel to each other and being movable toward and away from each other for accepting the dry film photoresist and varying thicknesses of substrate therebetween;
(b) means for adjusting the maximum spacing between the feed rollers;
(c) means for rotatably mounting a supply roll of dry film photoresist spaced from and parallel to the feed rollers for supplying dry dilm photoresist to the feed rollers;
(d) means for rotatably mounting a take-up roll parallel to the supply roll for taking up the polyethylene release layer of the photoresist as the polyethylene release layer is separated from the dry film photoresist, the take-up roll riding on the supply roll; and
(e) means for tensioning the dry film photoresist before it enters between the pair of feed rollers.

3. The apparatus of claim 2, wherein the tensioning means comprises a rotatable anti-pleater roller parallel to the feed rollers and positioned along the path of travel of the dry film photoresist between the supply roll and the feed rollers, the anti-pleater roller contacting the dry film photoresist, the anti-pleater roller rotating in a direction opposite to the direction of travel of the photoresist from the supply roll to the feed rollers.

4. The apparatus of claim 3, wherein the anti-pleater roller is positioned to ride against the one of the pair of feed rollers nearest the supply roll.

5. The apparatus of claim 4, wherein the diameter of the anti-pleater roller is about 0.375 times the diameter of the one of the pair of feed rollers.

6. The apparatus of claim 3, wherein the anti-pleater roller has a smooth stainless steel surface.

7. The apparatus of claim 2, wherein the feed roller deformable surfaces are made of an elastomer and are slightly tapered from a smaller diameter at their opposed ends to a larger diameter at their centers.

8. The apparatus of claim 1, wherein:
(a) the applying means comprises a pair of rotatable unheated feed rollers having deformably surfaces, at least one of the feed rollers being positively driven, the feed rollers being parallel to each other and being movable toward and away from each other for accepting the dry film photoresist and varying thicknesses of substrate therebetween;
(b) the removing means comprises a rotatably mounted take-up roll for taking up the polyethylene release layer, the take-up roll being mounted parallel to the feed rollers; and
(c) the tensing means comprises a rotatable anti-pleater roller parallel to the feed rollers and positioned along the path of travel of the dry film photoresist between the supply roll and the feed rollers, the anti-pleater roller contacting the dry film photoresist, the anti-pleater roller rotating in a direction opposite to the direction of travel of the photoresist from the supply roll to the feed rollers.

* * * * *